(12) United States Patent
Kuo (10) Patent No.: US 8,002,018 B2
(45) Date of Patent: Aug. 23, 2011

(54) THERMAL DISSIPATING DEVICE

(76) Inventor: Ching-Sung Kuo, Taipei County (TW)

( * ) Notice: Subject to any disclaimer, the term of this patent is extended or adjusted under 35 U.S.C. 154(b) by 974 days.

(21) Appl. No.: 11/907,278

(22) Filed: Oct. 10, 2007

(65) Prior Publication Data
US 2009/0095452 A1    Apr. 16, 2009

(51) Int. Cl.
*F28F 7/00* (2006.01)
(52) U.S. Cl. ...................................... 165/80.3; 361/703
(58) Field of Classification Search .................. 165/80.3, 165/144; 361/703
See application file for complete search history.

(56) References Cited

U.S. PATENT DOCUMENTS
6,675,885 B2 *   1/2004   Kuo .............................. 165/185
* cited by examiner

*Primary Examiner* — Teresa J Walberg
(74) *Attorney, Agent, or Firm* — Birch, Stewart, Kolasch & Birch, LLP (57) ABSTRACT

A thermal-dissipating device is made by connecting a plurality of thermal-dissipating sheets with each other. The thermal-dissipating sheets include a plurality of connecting portions and a plurality of thermal-dissipating fins. The connecting portions are connected with each other. The thermal-dissipating fins are connected with the connecting portions, respectively. At least one set of the thermal-dissipating fins are connected with each other.

19 Claims, 15 Drawing Sheets

THERMAL DISSIPATING DEVICE

BACKGROUND OF THE INVENTION

1. Field of Invention

The invention relates to a thermal-dissipating device.

2. Related Art

Recently, the electronic products usually have high performance, high operating frequencies, high speeds, and more compact sizes. However, they also generate more heat that may result in instability of the electronic products. The instability can affect the reliability and lifetime of the electronic products. Therefore, heat dissipation has become an important issue of electronic products, and thermal-dissipating devices are commonly used for dissipating heat.

A conventional thermal-dissipating device has a plurality of thermal-dissipating sheets connecting with each other. Each of the thermal-dissipating sheets has a connecting portion and a thermal-dissipating fin. The thermal-dissipating fin is extended outwardly from one side of the connecting portion. During the assembling process, the thermal-dissipating sheets are connected side by side and then spread out from each other so as to form a thermal-dissipating device. Thus, there is a space between the thermal-dissipating fins of the thermal-dissipating sheets. When the connecting portions of the thermal-dissipating device are in touch with a heat source, the heat can be transferred via the connecting portions to the thermal-dissipating fins. The air conduction and convection can then help to remove the heat. However, the structure of the conventional thermal-dissipating device limits its design, and thus no new design of the thermal-dissipating device is invented recently.

Therefore, it is an important subject of the invention to provide a thermal-dissipating device that has a novel design that can render a wider market and more applications.

SUMMARY OF THE INVENTION

In view of the foregoing, the invention is to provide a thermal-dissipating device that has a novel design that can render a wider market and more applications.

To achieve the above, the invention discloses a thermal-dissipating device formed by connecting a plurality of thermal-dissipating sheets. Each of the thermal-dissipating sheets includes a plurality of connecting portions and a plurality of thermal-dissipating fins. The connecting portions are connected with each other, and the thermal-dissipating fins are connected with the connecting portion, respectively. At least one set of the thermal-dissipating fins are connected with each other.

To achieve the above, the invention also discloses a thermal-dissipating device formed by continuously bending at least one thermal-dissipating sheet to render a plurality of bending sections. Each of the bending sections includes a connecting portion and at least one thermal-dissipating fin. The connecting potions are connected with each other. The thermal-dissipating fin is connected with the connecting portion, and the thermal-dissipating fins are connected with each other by at least one end.

As mentioned above, the thermal-dissipating device of the invention can have several different design aspects. For example, the thermal-dissipating sheets are bent once before they are stacked together or covered within each other. Alternatively, the thermal-dissipating sheets can be bent several times before they are stacked together or covered within each other. In comparison with the related art, the invention provides versatile designs that can increase the applicability and potential market.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Single-Folded and Single-Sided

Figure 1:
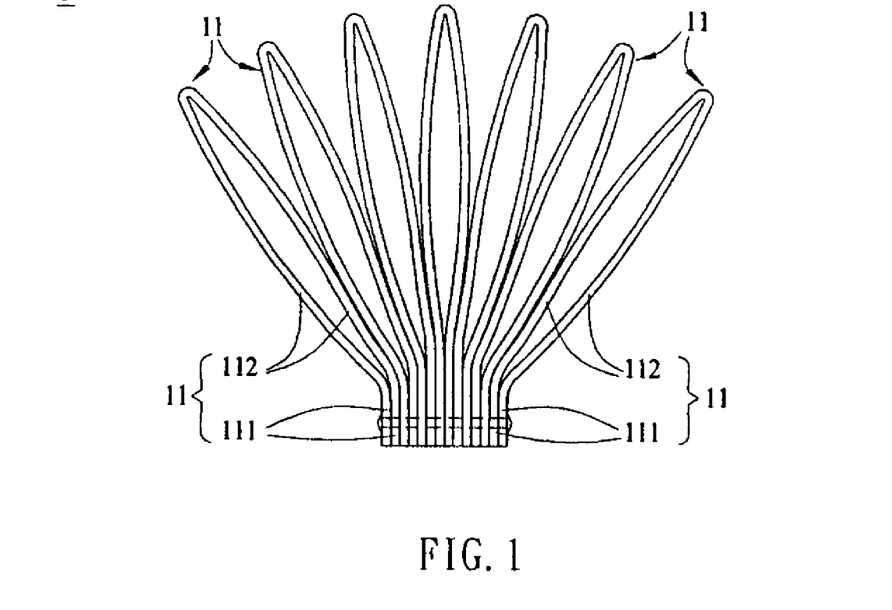
FIG. 1 is a schematic view of a thermal-dissipating device according to a first embodiment of the invention.

FIG. 1 is a side view of the thermal-dissipating device 1 according to a first embodiment of the invention. The thermal-dissipating device 1 includes a plurality of thermal-dissipating sheets 11, each of which has two connecting portions 111 and two thermal-dissipating fins 112. The connecting portions 111 are located on two ends of the thermal-dissipating sheet 11. The thermal-dissipating fins 112 are connected with the connecting portions 111, respectively, and extended from the connecting portions 111 outwards. The connecting portions 111 are connected with each other by screwing or riveting. This embodiment uses the riveting connection as an example. At least one set of the thermal-dissipating fins 112 are connected with each other.

As shown in FIG. 1, the thermal-dissipating device 1 has, for example but not limited to, seven sets of thermal-dissipating fins 112, and each set includes two thermal-dissipating fins 112. In practice, the thermal-dissipating fins 112 can be formed by bending a long stripe of thermal-dissipating sheet 11. That is, the thermal-dissipating sheet 11 can be a single-folded sheet.

In this embodiment, the shape, size and material of the thermal-dissipating sheets 11 can be the same or different. Besides, the thermal-dissipating sheets 11 can be disposed side by side along the same or different directions. Of course, the thermal-dissipating sheets 11 can also be disposed in a crisscross way.

Figure 1A:
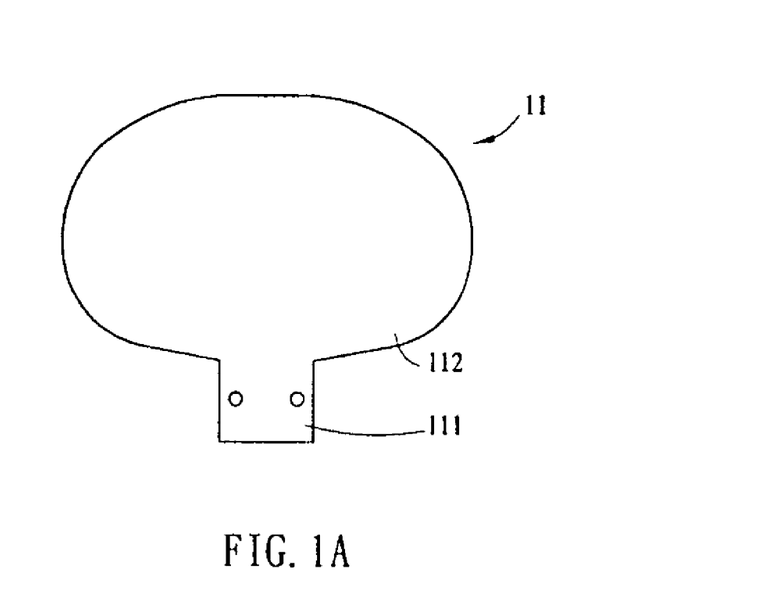
FIG. 1A is a schematic view of the thermal-dissipating sheet in FIG. 1.

FIG. 1A is a side view of the thermal-dissipating sheets 11 in the thermal-dissipating device 1. Regarding to the thermal-dissipating sheet 11, the area of the thermal-dissipating fin 112 can be larger than that of the connecting portion 111 for increasing the area for dissipating heat and thus enhancing the thermal-dissipating efficiency.

Second Embodiment

Single-Folded, Double-Layered, and Single-Sided

Figure 2:
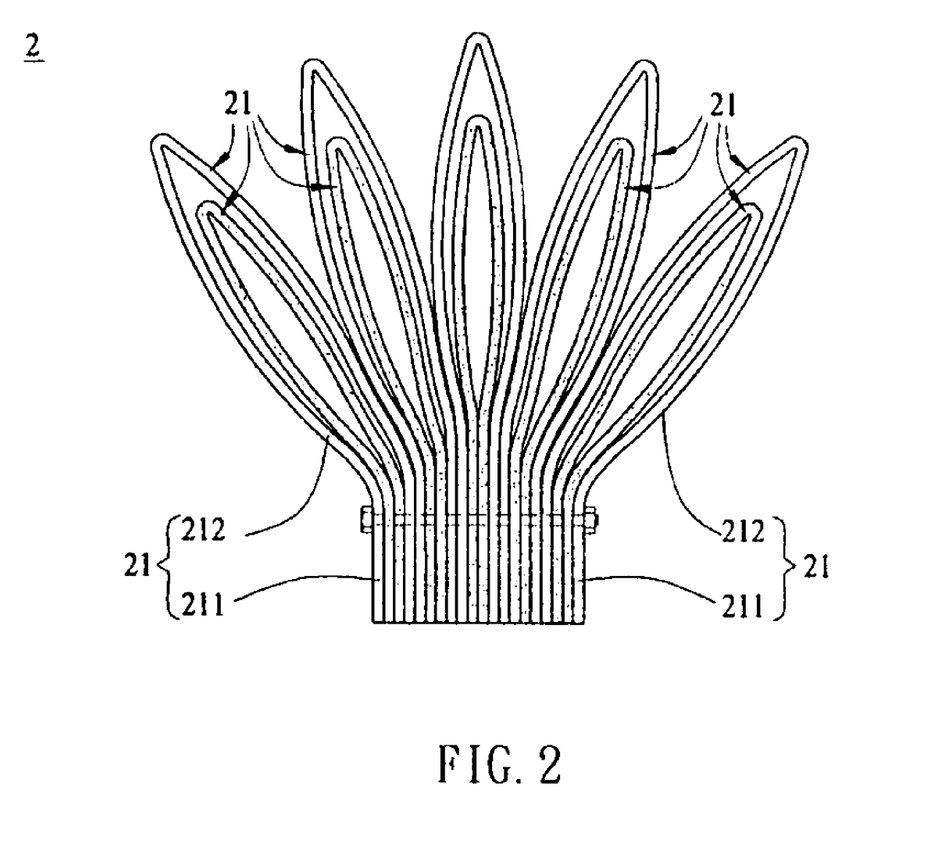
FIG. 2 is a schematic view of a thermal-dissipating device according to a second embodiment of the invention.

FIG. 2 is a side view of a thermal-dissipating device 2 according to the second embodiment of the invention. The difference between this thermal-dissipating device 2 and the thermal-dissipating device 1 in the first embodiment is that the thermal-dissipating sheets 21 of the thermal-dissipating device 2 are combined to provide a double-layered structure. In this embodiment, two thermal-dissipating sheets 21 of different sizes are disposed along the same direction to form a set of double-layered thermal-dissipating sheets 21. Several sets of thermal-dissipating sheets 21 are then stacked and connected by, for example, screwing. Of course, they can be disposed along different directions as well.

Third Embodiment

Single-Folded, Double-Layered, and Double-Sided

Figure 3:
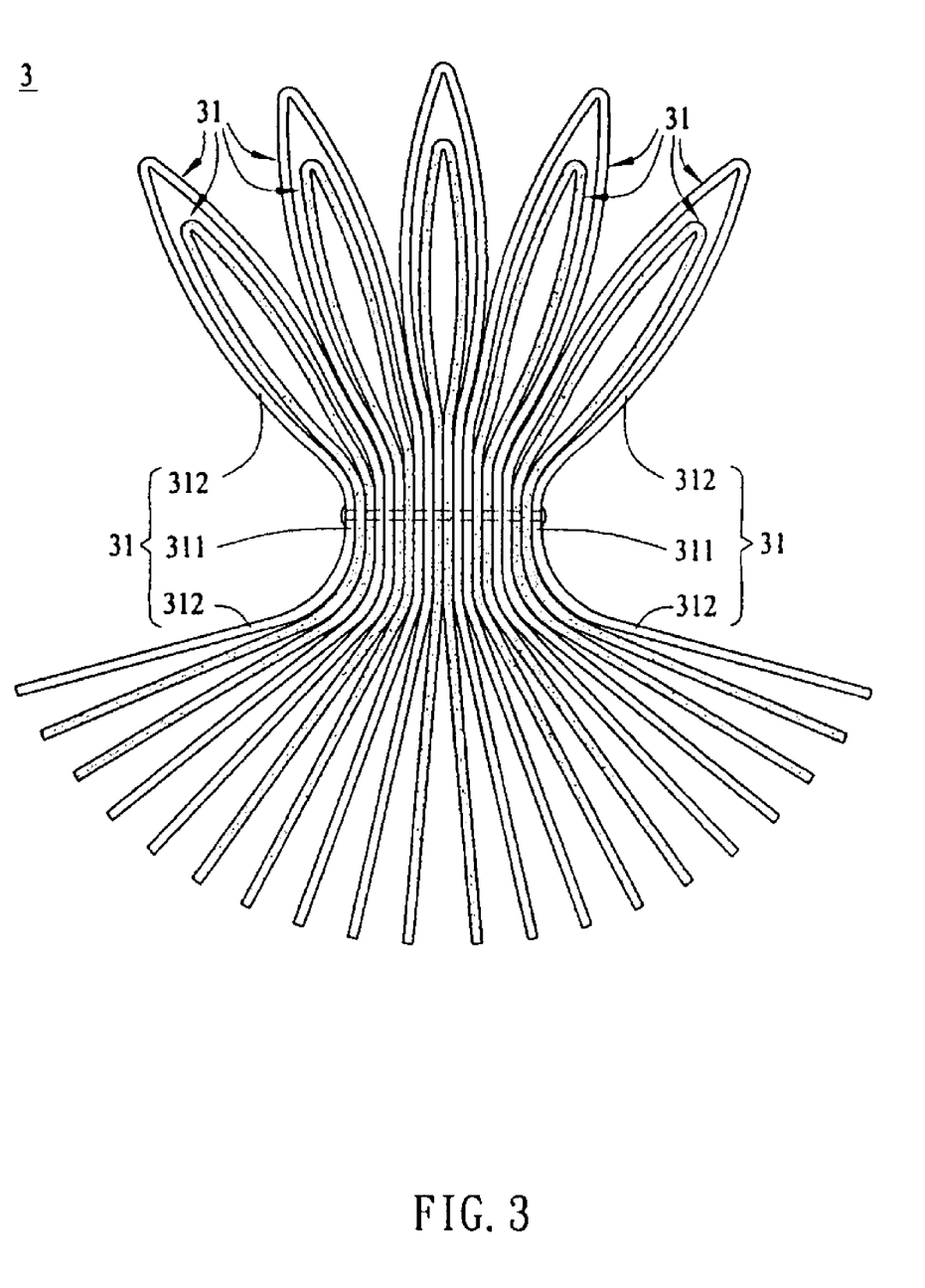
FIG. 3 is a schematic view of a thermal-dissipating device according to a third embodiment of the invention.

FIG. 3 is a top view of a thermal-dissipating device 3 according to the third embodiment of the invention. The difference between the thermal-dissipating device 3 and the thermal-dissipating device 2 is that the connecting portion 311 of the thermal-dissipating sheet 31 in the thermal-dissipating device 3 is located at the central portion of the thermal-dissipating sheet 31. The thermal-dissipating sheets 31 are further bent one more time before they are connected so as to form a double-sided, double-layered structure.

Fourth Embodiment

Single-Folded, Single-Layered, Double-Sided, and One-Large-and-One-Small

Figure 4:
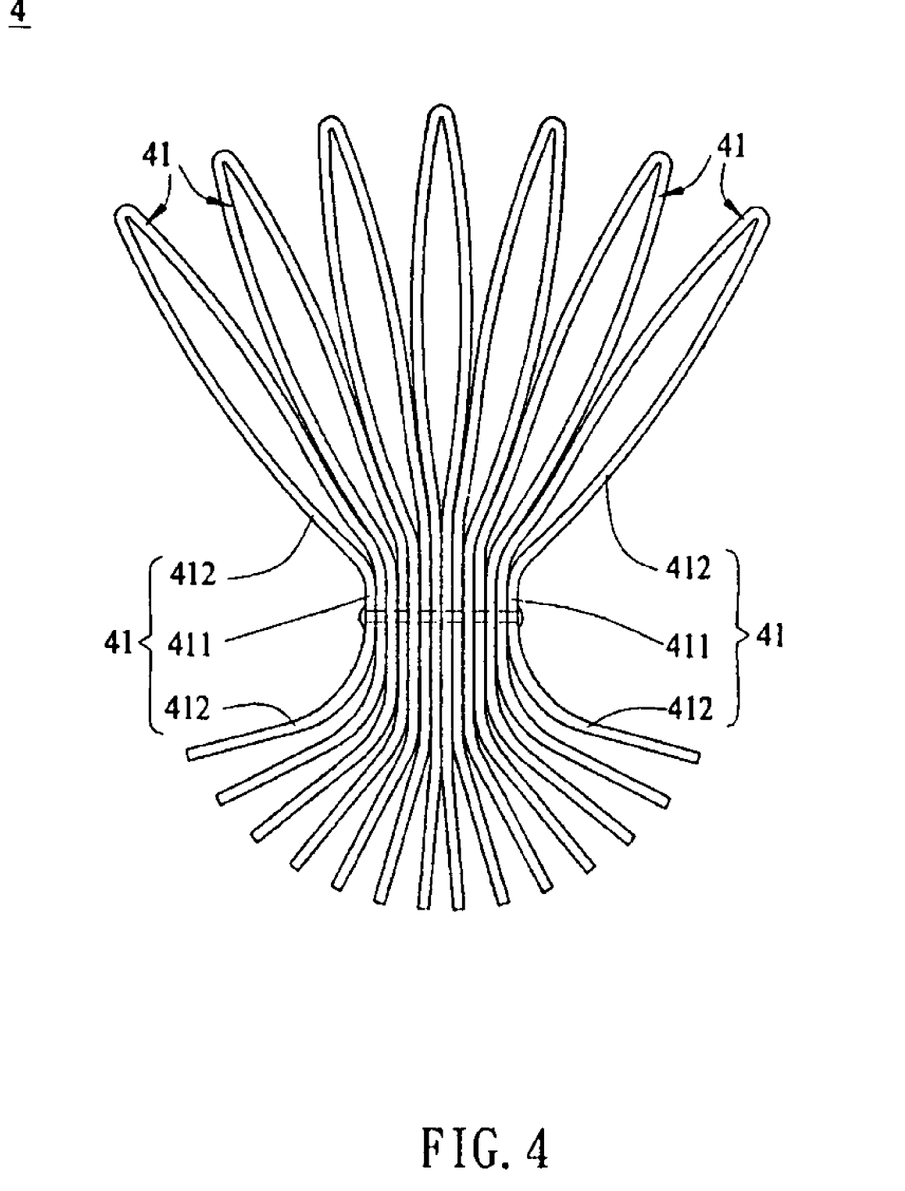
FIG. 4 is a schematic view of a thermal-dissipating device according to a fourth embodiment of the invention.

FIG. 4 is a top view of a thermal-dissipating device 4 according to the fourth embodiment of the invention. The difference between the thermal-dissipating device 4 and the thermal-dissipating device 1 is that the connecting portion 411 of the thermal-dissipating sheet 41 in the thermal-dissipating device 4 is located between one end of the thermal-dissipating sheet 41 and its center, thereby forming a one-large-and-one-small double-sided structure. The term "one-large-and-one-small" refers herein to the configuration that the sizes of the portions of the thermal-dissipating sheet 41 disposed on two sides of the connecting portion 411 are different.

Fifth Embodiment

Single-Folded, Double-Layered, Double-Sided, and One-Large-and-One-Small

Figure 5:
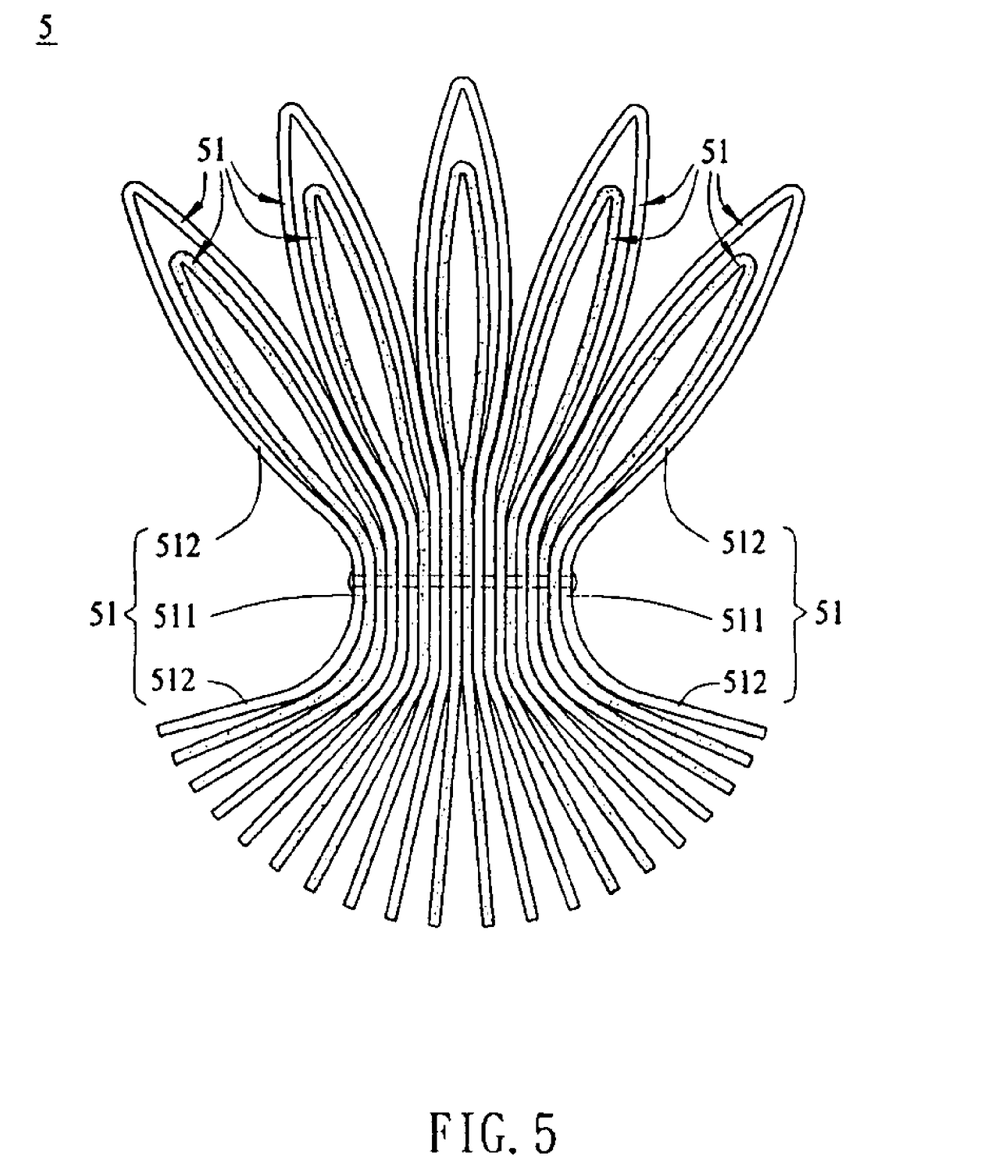
FIG. 5 is a schematic view of a thermal-dissipating device according to a fifth embodiment of the invention.

FIG. 5 is a top view of a thermal-dissipating device 5 according to the fifth embodiment of the invention. The difference between the thermal-dissipating device 5 and the thermal-dissipating device 3 is that the connecting portion 511 of the thermal-dissipating sheet 51 in the thermal-dissipating device 5 is located between one end of the thermal-dissipating sheet 51 and its center, thereby forming a one-large-and-one-small double-layered structure.

Sixth Embodiment

Double-Folded and Double-Sided

Figure 6:
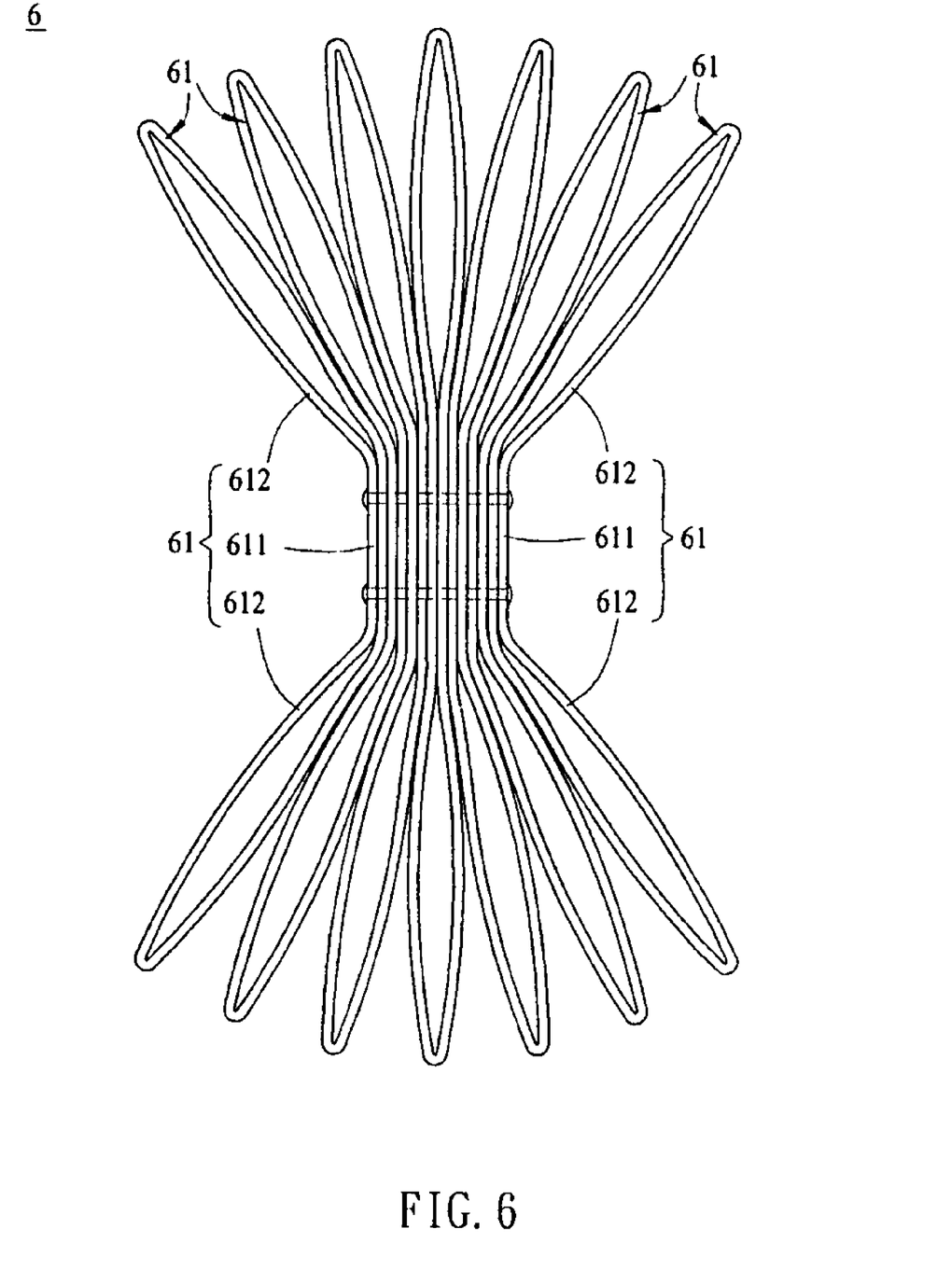
FIG. 6 is a schematic view of a thermal-dissipating device according to a sixth embodiment of the invention.

FIG. 6 is a top view of a thermal-dissipating device 6 according to the sixth embodiment of the invention. The difference between the thermal-dissipating device 6 and the thermal-dissipating device 4 is that four thermal-dissipating fins 612 are disposed at two sides of the thermal-dissipating sheet 61, and every two thermal-dissipating fins 612 disposed at the same side are connected with each other. Thus, each of the thermal-dissipating sheets 61 can be viewed as a sheet with double folding. The thermal-dissipating sheets 61 are further stacked together through their connecting portions 611. In practice, two ends of a stripe sheet can be connected to form the thermal-dissipating sheet 61 with double folding.

Seventh Embodiment

Double-Folded, Double-Layered, and Double-Sided

Figure 7:
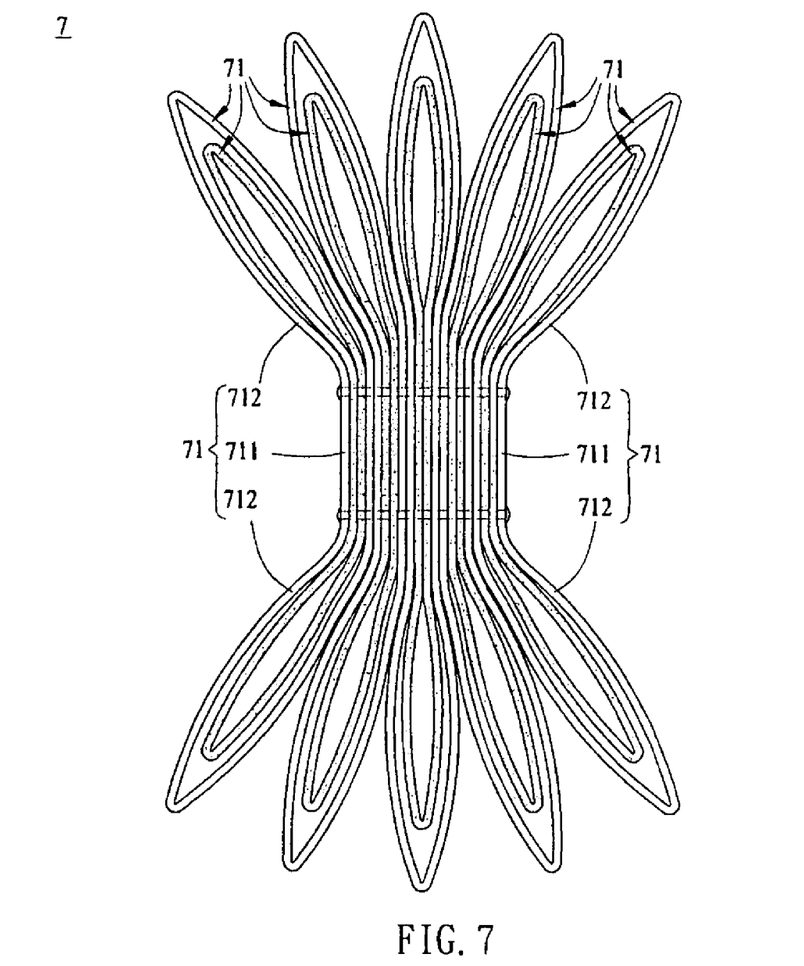
FIG. 7 is a schematic view of a thermal-dissipating device according to a seventh embodiment of the invention.

FIG. 7 is a top view of a thermal-dissipating device 7 according to the seventh embodiment of the invention. The difference between the thermal-dissipating device 7 and the thermal-dissipating device 3 is that four thermal-dissipating fins 712 are disposed at two sides of the thermal-dissipating sheet 71, and every two thermal-dissipating fins 712 disposed at the same side are connected with each other. Thus, each thermal-dissipating sheet 71 can be viewed as a sheet with double folding. Two thermal-dissipating sheets 71 of different sizes are then combined to form a set of double-layered thermal-dissipating sheets 71. Several sets of such thermal-dissipating sheets 71 are then stacked together. In this embodiment, the connecting portion 711 of the thermal-dissipating sheet 712 is disposed at the center of the thermal-dissipating sheet 71, so that a double-folded, double-layered, and double-sided structure is obtained.

Figure 7A:
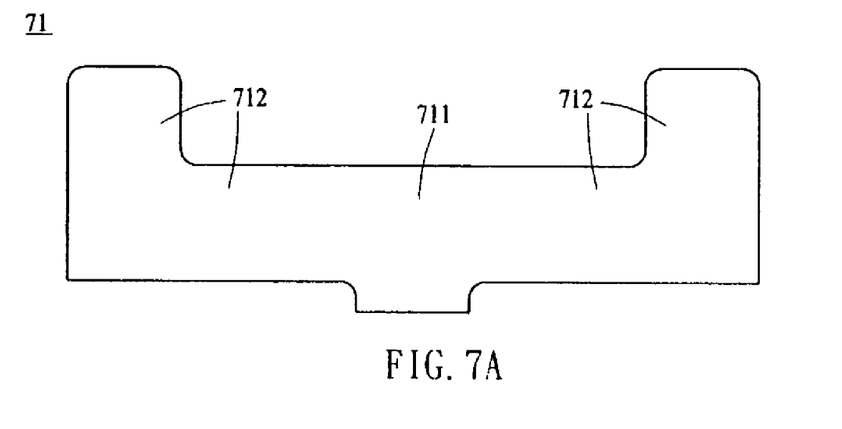
FIG. 7A is a schematic view of one of the thermal-dissipating sheets in FIG. 7.

FIG. 7A is a side view of the thermal-dissipating sheet 71 in the thermal-dissipating device 7. To enhance the thermal-dissipating efficiency, the top edge of the thermal-dissipating fin 712 of each thermal-dissipating sheet 71 can be higher than that of the connecting portion 711, and the area of the thermal-dissipating fin 712 can be larger than that of the connecting portion 711. Besides, the bottom edge of the connecting portion 711 of each thermal-dissipating sheet 71 protrudes relative to the bottom edge of the thermal-dissipating fin 712 for direct contact with the heat source (such as a processing chip).

Eighth Embodiment

Double-Folded, Double-Layered, Double-Sided, and One-Large-and-One-Small

Figure 8:
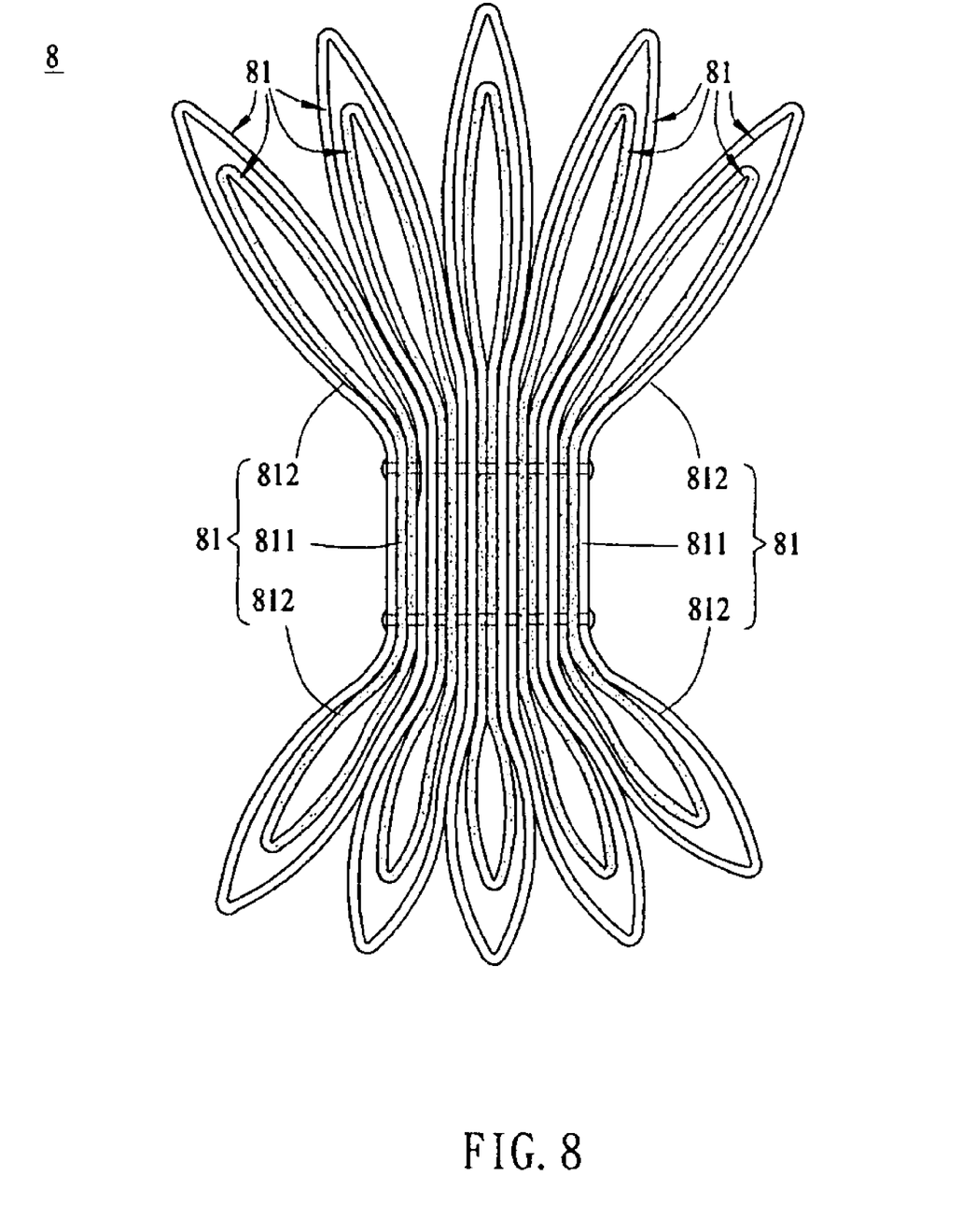
FIG. 8 is a schematic view of a thermal-dissipating device according to an eighth embodiment of the invention.

FIG. 8 is a top view of a thermal-dissipating device 8 according to the eighth embodiment of the invention. The difference between the thermal-dissipating device 8 and the thermal-dissipating device 7 is that the connecting portion 811 of the thermal-dissipating sheet 81 in the thermal-dissipating device 8 is located between one end of the thermal-dissipating sheet 81 and its center, forming a one-large-and-one-small double-layered structure.

Ninth Embodiment

Double-Folded or Single-Folded, Double-Sided, and One-Large-and-One-Small

Figure 9:
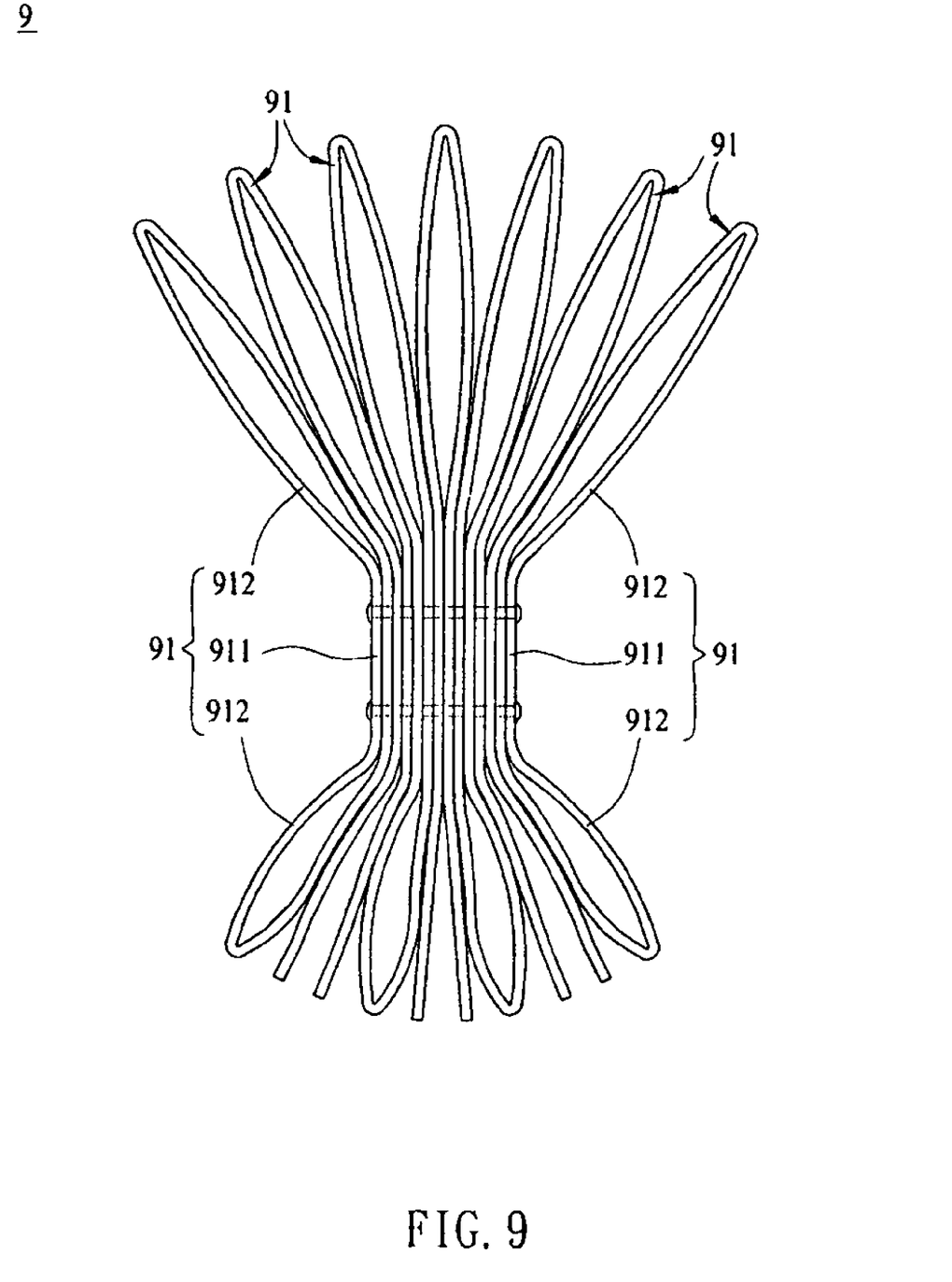
FIG. 9 is a schematic view of a thermal-dissipating device according to a ninth embodiment of the invention.

FIG. 9 is a top view of a thermal-dissipating device 9 according to the ninth embodiment of the invention. The thermal-dissipating device 9 includes several thermal-dissipating sheets 91 connected together. The thermal-dissipating sheets 91 include two aspects. In the first aspect, two thermal-dissipating fins 912 on one side of the thermal-dissipating sheet 91 are connected together (similar to the thermal-dissipating sheet 41 of FIG. 4). In the second aspect, every two thermal-dissipating fins 912 disposed at the same side are connected with each other (similar to the thermal-dissipating sheet 61 of FIG. 6). In this embodiment, the thermal-dissipating sheets 91 of the first aspect and the thermal-dissipating sheets 91 of the second aspect are alternately arranged. In addition, the connecting portion 911 is located between one end of the thermal-dissipating sheet 91 and its center, thereby forming a one-large-and-one-small double-sided structure.

Tenth Embodiment

Double-Folded, Single-Layered, and Triple-Sided

Figure 10:
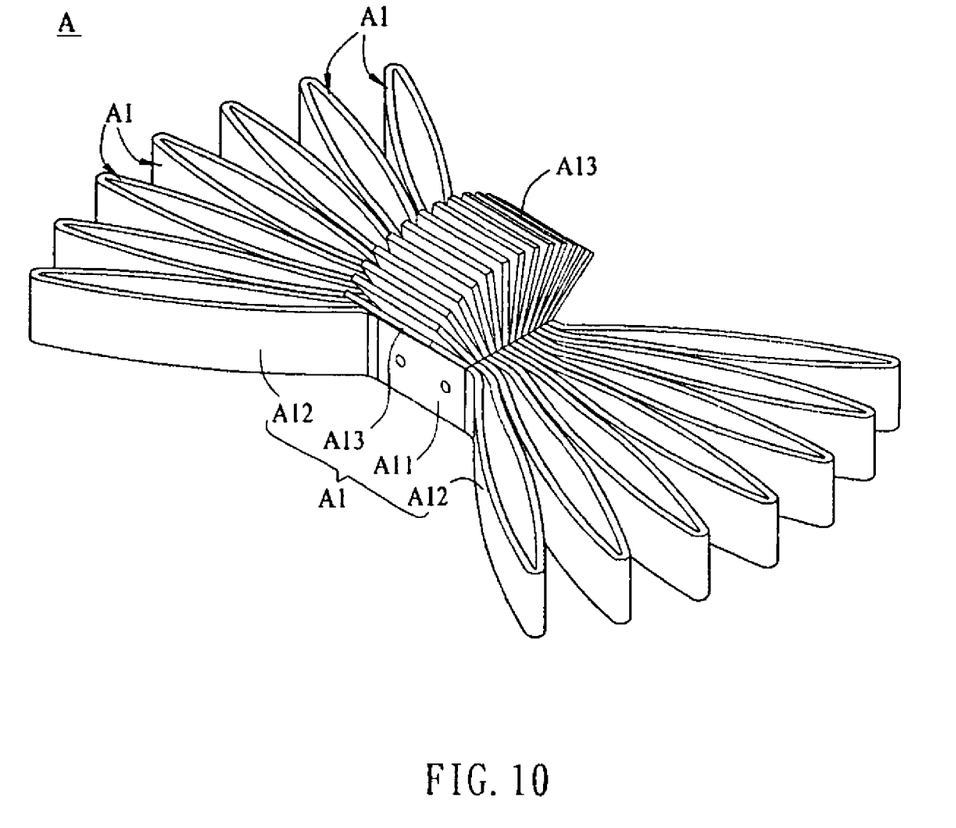
FIG. 10 is a schematic view of a thermal-dissipating device according to a tenth embodiment of the invention.

FIG. 10 is a three-dimensional view of a thermal-dissipating device A. The thermal-dissipating device A is formed by connecting several thermal-dissipating sheets A1. Each thermal-dissipating sheet A1 has two connecting portions A11, four thermal-dissipating fins A12, and two thermal-dissipating portions A13. Two thermal-dissipating fins A12 and one thermal-dissipating portion A 13 extend outwards from one connecting portion A11. The thermal-dissipating fins A 12 on the same side of the thermal-dissipating sheet A1 are connected with each other, forming a double-folded sheet. The thermal-dissipating portions A13 are spread out to increase the thermal-dissipating area, thus increasing the thermal-dissipating efficiency.

Eleventh Embodiment

Continuously-Folded and Double-Sided

Figure 11:
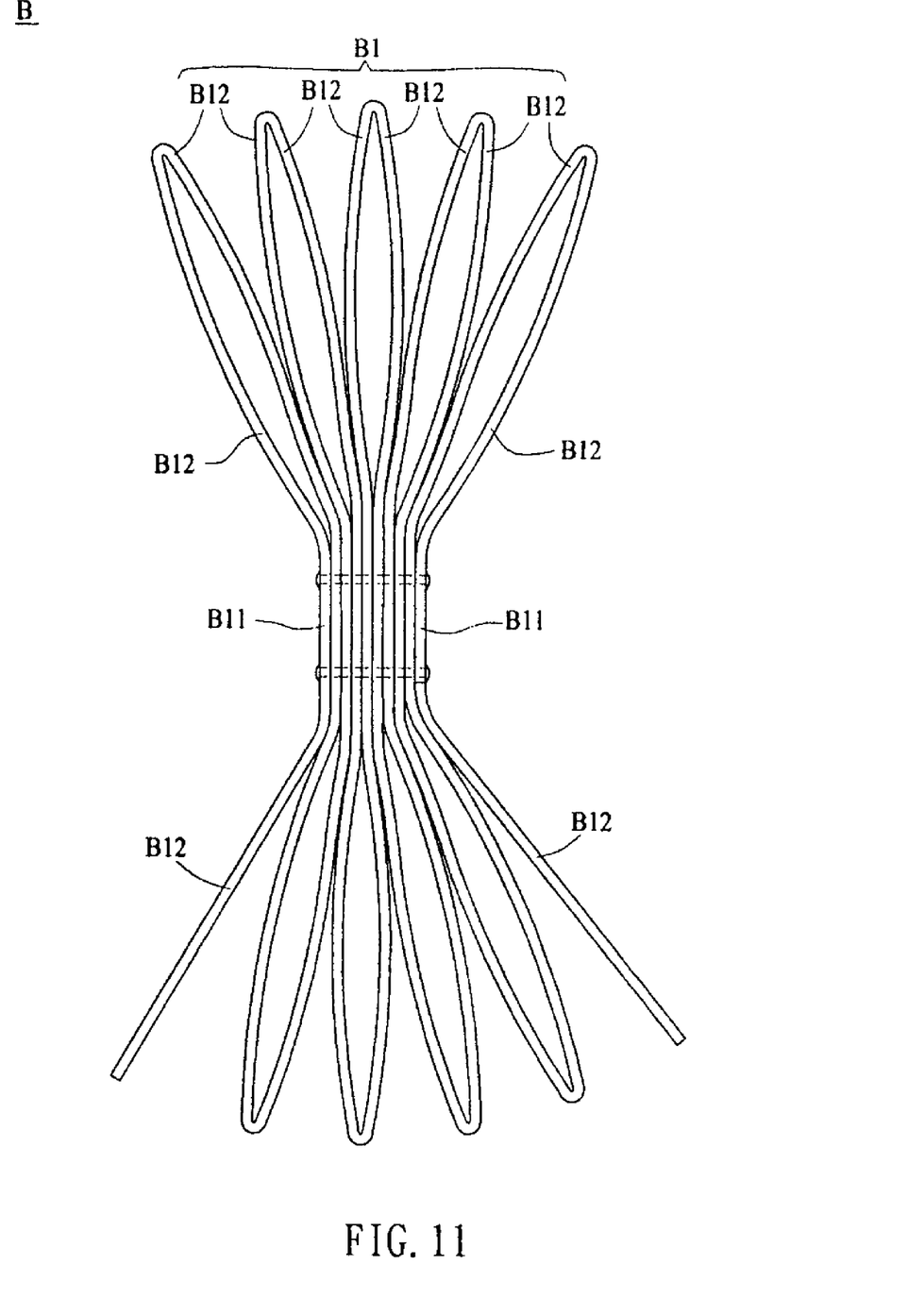
FIG. 11 and FIG. 11A are schematic views of a thermal-dissipating device according to an eleventh embodiment of the invention.

FIG. 11 is a top view of a thermal-dissipating device B according to the eleventh embodiment of the invention. The thermal-dissipating device B has several bending sections formed by continuously bending at least one thermal-dissipating sheet B1. Each bending section includes one connecting portion B11 and at least one thermal-dissipating fin B12. Each of the connecting portions B11 is disposed at the center of the corresponding bending section B1. The connecting portions B11 are connected with each other by, for example, screwing or riveting. Each of the thermal-dissipating fins B12 is connected with the corresponding connecting portion B11. The continuous two thermal-dissipating fins B12 are connected with each other.

Besides, in this embodiment, the top edge of the thermal-dissipating fin B12 of the thermal-dissipating sheet B1 can be higher than that of the connecting portion B11 (similar to the thermal-dissipating fin 712 and the connecting portion 711 of FIG. 7A), and the area of the thermal-dissipating fin B12 can be larger than that of the connecting portion B11. Moreover, the bottom edge of the connecting portion B11 of each thermal-dissipating sheet B1 protrudes relative to the bottom edge of the thermal-dissipating fin B12 for direct contact with the heat source (such as a processing chip).

If the connecting portion B11 of each bending section is located on one end thereof, then it forms the continuously-folded and single-sided aspect.

Figure 11A:
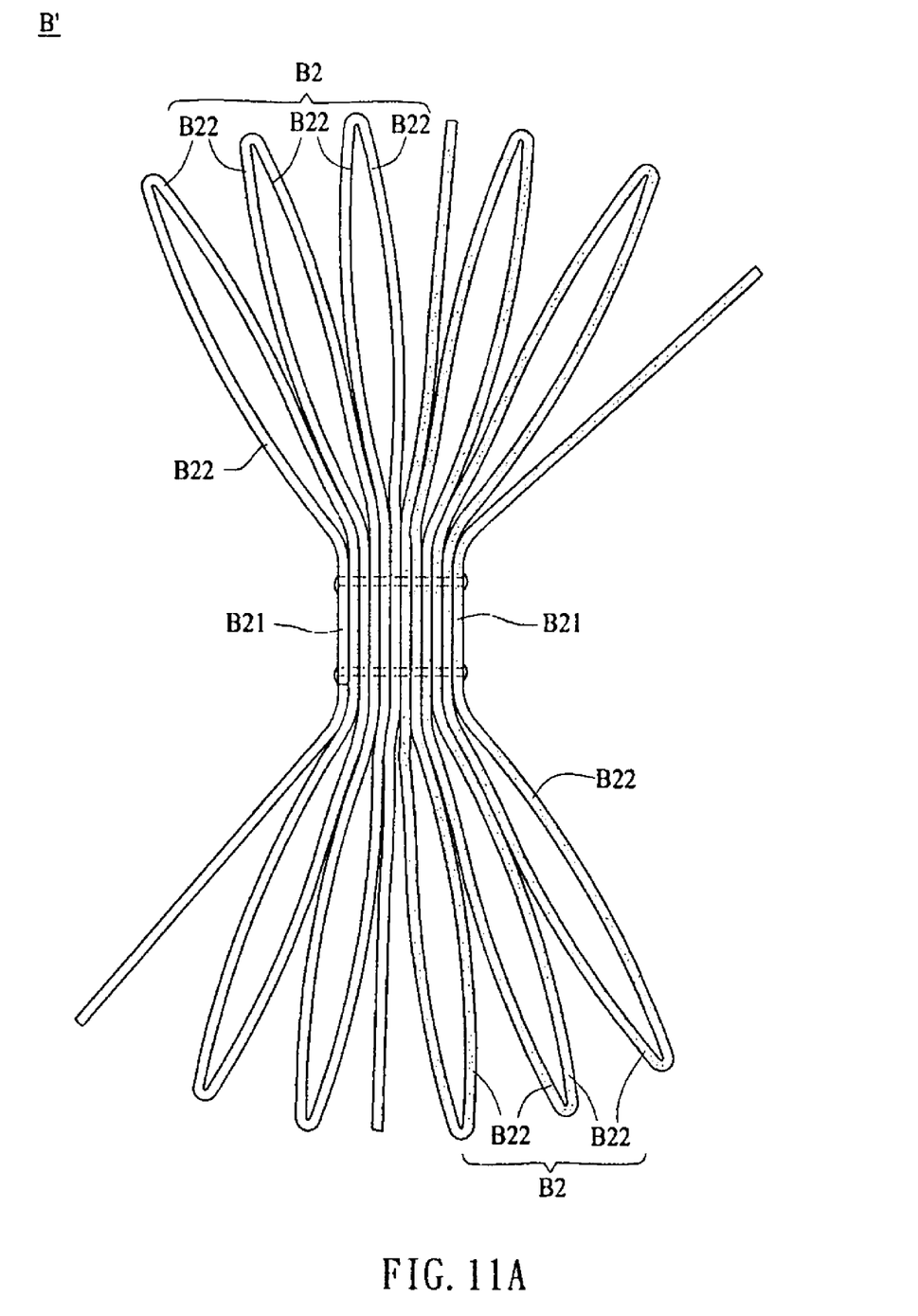

FIG. 11A shows a thermal-dissipating device B' formed by continuously bending two thermal-dissipating sheets B2 that are disposed side by side. The two thermal-dissipating sheets B2 are disposed along different directions and connected by, for example, screwing or riveting. The thermal-dissipating sheets B2 can also be disposed in the same direction, and can be connected side by side, in a crisscross way, or covered within each other.

Twelfth Embodiment

Continuously-Folded, Double-Sided, and One-Large-and-One-Small

Figure 12:
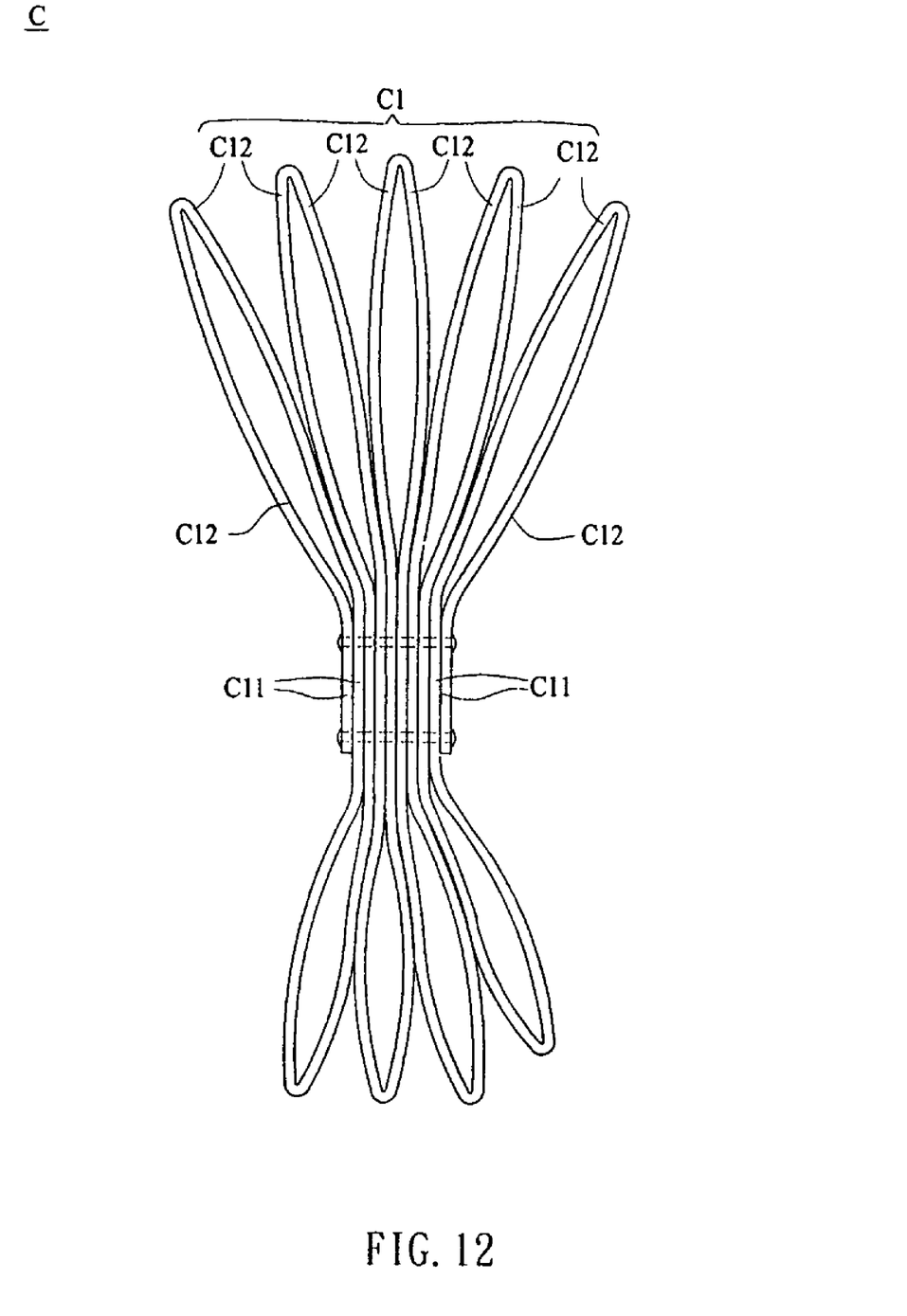
FIG. 12 is a schematic view of a thermal-dissipating device according to a twelfth embodiment of the invention.

FIG. 12 is a top view of a thermal-dissipating device C according to the twelfth embodiment of the invention. The thermal-dissipating device C and the thermal-dissipating device B are different in that the connecting portion C11 of the thermal-dissipating sheet C1 in the thermal-dissipating device C is disposed between one end of the bending section and its center, forming a one-large-and-one-small double-sided structure.

Thirteenth Embodiment

Continuously-Folded and Triple-Sided

Figure 13:
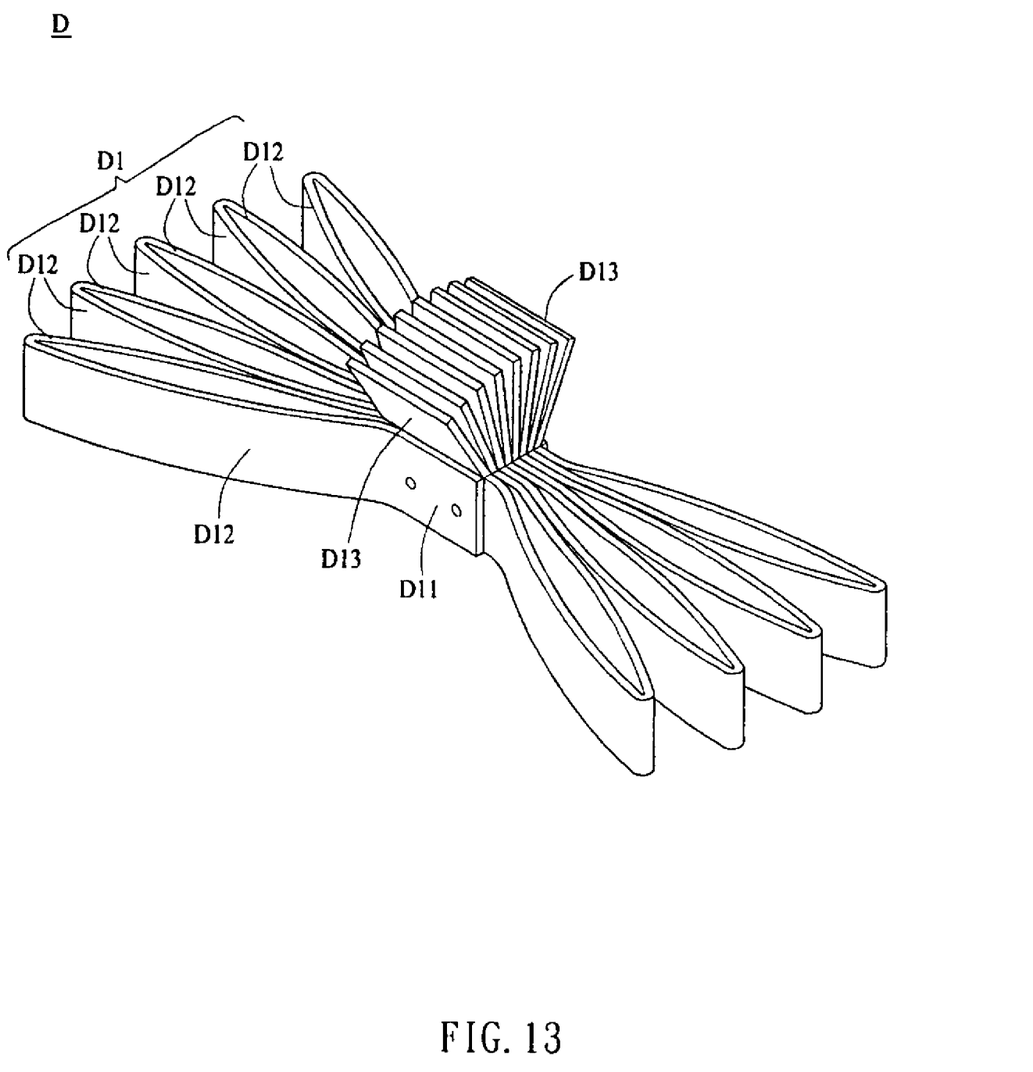
FIG. 13 is a schematic view of a thermal-dissipating device according to a thirteenth embodiment of the invention.

FIG. 13 is a three-dimensional view of a thermal-dissipating device D according to the thirteenth embodiment of the invention. The thermal-dissipating device D and the thermal-dissipating device B are different in that the thermal-dissipating sheet D1 of the thermal-dissipating device D further includes a plurality of thermal-dissipating portions D13, extending outwards from the connecting portions D11, respectively, and spreading out.

Fourteenth Embodiment

Continuously-Folded, Double-Layered, and Double-Sided

Figure 14:
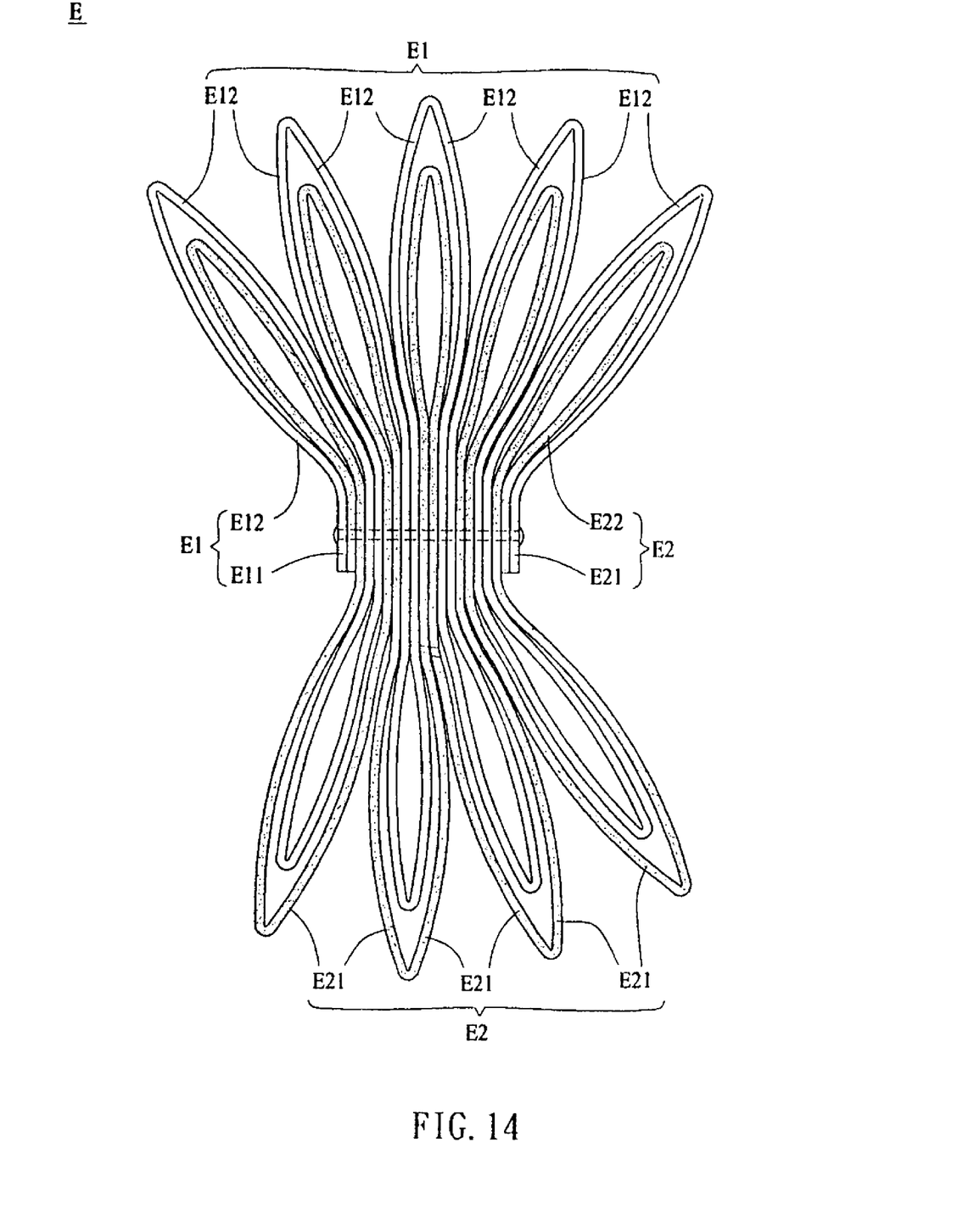
FIG. 14 is a schematic view of a thermal-dissipating device according to a fourteenth embodiment of the invention.

FIG. 14 is a top view of a thermal-dissipating device E according to the fourteenth embodiment of the invention. The thermal-dissipating device E and the thermal-dissipating device B are different in that the thermal-dissipating device E is formed by combining two thermal-dissipating sheets E1 and E2, whose shapes, sizes, and materials can be the same or different. Moreover, the thermal-dissipating sheets E1 and E2 can be disposed along the same or different directions, and be arranged side by side, in a crisscross way, or covered within each other (as shown in FIG. 14).

Besides, the thermal-dissipating device E can be configured with several thermal-dissipating portions to increase its thermal-dissipating efficiency. The positions of the thermal-dissipating portions are the same as described before and not repeated here again.

In summary, the thermal-dissipating device of the invention can have several different design aspects. For example, the thermal-dissipating sheets are bent once before they are stacked together or covered within each other. Alternatively, the thermal-dissipating sheets can be bent several times before they are stacked together or covered within each other. In comparison with the related art, the invention provides versatile designs that can increase the applicability and potential market.

Although the invention has been described with reference to specific embodiments, this description is not meant to be construed in a limiting sense. Various modifications of the disclosed embodiments, as well as alternative embodiments, will be apparent to persons skilled in the art. It is, therefore, comtemplated that the appended claims will cover all modifications that fall within the true scope of the invention.

What is claimed is:

1. A thermal-dissipating device formed by connecting a plurality of thermal-dissipating sheets, each of the thermal-dissipating sheets comprising:
    a plurality of connecting portions connected with each other; and
    a plurality of thermal-dissipating fins extended outwards from the connecting portion, respectively, wherein at least one set of the thermal-dissipating fins are bent to be joined at ending sides thereof.

2. The thermal-dissipating device of claim 1, wherein the shapes, sizes, and materials of the thermal-dissipating sheets are the same or different.

3. The thermal-dissipating device of claim 2, wherein the thermal-dissipating sheets are disposed side by side, in a crisscross way, or covered within each other.

4. The thermal-dissipating device of claim 3, wherein the thermal-dissipating sheets are connected along the same direction or different directions.

5. The thermal-dissipating device of claim 1, wherein the connecting portion is disposed on one end of the thermal-dissipating sheet, at the center of the thermal-dissipating sheet, or between one end and the center of the thermal-dissipating sheet.

6. The thermal-dissipating device of claim 1, wherein each of the thermal-dissipating sheets further comprises:
    at least one thermal-dissipating portion extended outwards from the connecting portion in different directions from the thermal-dissipating fins.

7. The thermal-dissipating device of claim 6, wherein the thermal-dissipating portions spread out from each other.

8. The thermal-dissipating device of claim 1, wherein the area of the thermal-dissipating fin of each of the thermal-dissipating sheets is larger the area that of the connecting portion.

9. The thermal-dissipating device of claim 1, wherein the top edge of the thermal-dissipating fin of each of the thermal-dissipating sheets is higher than the top edge of the connecting portion.

10. The thermal-dissipating device of claim 1, wherein the bottom edge of the connecting portion of each of the thermal-dissipating sheets protrudes relative to the bottom edge of the thermal-dissipating fin.

11. A thermal-dissipating device formed by continuously bending at least one thermal-dissipating sheet to render a plurality of bending sections, each of the bending sections comprising:
    a connecting portion, wherein the connecting portions are connected with each other; and
    at least one thermal-dissipating fin extended outwards from the connecting portion, wherein the thermal-dissipating fins are bent to be joined at ending sides thereof.

12. The thermal-dissipating device of claim 11, wherein when the thermal-dissipating device is formed by a plurality of thermal-dissipating sheets, the shapes, sizes, and materials of the thermal-dissipating sheets are the same or different.

13. The thermal-dissipating device of claim 12, wherein the thermal-dissipating sheets are disposed side by side, in a crisscross way, or covered within each other.

14. The thermal-dissipating device of claim 13, wherein the thermal-dissipating sheets are connected along the same direction or different directions.

15. The thermal-dissipating device of claim 11, wherein the connecting portion is disposed on one end of the bending section, at the center of the bending section, or between one end and the center of the bending portion.

16. The thermal-dissipating device of claim 11, wherein each of the bending sections further comprises:
    at least one thermal-dissipating portion extended outwards from the connecting portion in different directions from the thermal-dissipating fins.

17. The thermal-dissipating device of claim 11, wherein the area of the thermal-dissipating fin is larger than the area of the connecting portion.

18. The thermal-dissipating device of claim 11, wherein the top edge of the thermal-dissipating fin is higher than the top edge of the connecting portion.

19. The thermal-dissipating device of claim 11, wherein the bottom edge of the connecting portion protrudes relative to the bottom edge of the thermal-dissipating fin.

* * * * *